United States Patent
Kostamaa et al.

(10) Patent No.: US 7,383,270 B1
(45) Date of Patent: Jun. 3, 2008

(54) COMPRESSING DATA STORED IN AN INTERMEDIATE OR RESULT TABLE OF A DATABASE

(75) Inventors: O. Pekka Kostamaa, Santa Monica, CA (US); J. Mark Morris, Poway, CA (US)

(73) Assignee: Teradata US, Inc., Miamisburg, OH (US)

( * ) Notice: Subject to any disclaimer, the term of this patent is extended or adjusted under 35 U.S.C. 154(b) by 458 days.

(21) Appl. No.: 10/770,796

(22) Filed: Feb. 3, 2004

(51) Int. Cl.
*G06F 17/30* (2006.01)
*G06F 7/00* (2006.01)
(52) U.S. Cl. .......................... 707/101; 707/3; 707/102
(58) Field of Classification Search .............. 707/1–10, 707/100–104.1
See application file for complete search history.

(56) References Cited

U.S. PATENT DOCUMENTS

| | | | |
|---|---|---|---|
| 5,412,804 A * | 5/1995 | Krishna | 707/2 |
| 5,640,584 A | 6/1997 | Kandasamy et al. | |
| 5,864,842 A | 1/1999 | Pederson et al. | |
| 5,872,904 A | 2/1999 | McMillen et al. | |
| 5,884,299 A | 3/1999 | Ramesh et al. | |
| 6,226,628 B1 * | 5/2001 | Forbes | 707/1 |
| 7,024,414 B2 * | 4/2006 | Sah et al. | 707/101 |
| 2004/0181514 A1 * | 9/2004 | Santosuosso | 707/3 |

OTHER PUBLICATIONS

U.S. Appl. No. 10/002,795, filed Nov. 15, 2001, Reed et al.
Mark Morris, "Teradata Multi-Value Compression V2R5.0," pp. 1-12 (Jul. 2002).

* cited by examiner

*Primary Examiner*—Hosain Alam
*Assistant Examiner*—Sangwoo Ahn
(74) *Attorney, Agent, or Firm*—Trop, Pruner & Hu P.C.

(57) ABSTRACT

A database system receives a transaction specifying one or more conditions to apply to a first table, and inserts data selected in the transaction into a second. The database system further generates a value list used for compressing a column of the second table, where generating the value list comprises one of inheriting entries of the value list from another value list associated with the first table, and deriving the value list based on the one or more conditions to apply on the first table.

19 Claims, 3 Drawing Sheets

COMPRESSING DATA STORED IN AN INTERMEDIATE OR RESULT TABLE OF A DATABASE

BACKGROUND

A database is a collection of logically related data arranged in a predetermined format, such as in tables that contain rows and columns. To access the content of a table in the database, queries according to a standard database query language are submitted to the database system. Queries can be issued to insert new entries into a table of a database (such as to insert a row into the table), modify the content of the table, and delete entries from the table.

In many database systems, tables can be quite large, which consumes large amounts of storage capacity. To enhance storage efficiency, compression can be applied to data stored in database tables. One type of compression is value list compression. With value list compression, frequently occurring data values of a column in a table are determined. For the identified frequently occurring column data values, special encoded values are used in place of respective frequently occurring column data values. The special encoded values are made up of a fixed number of bits (e.g., an 8-bit value, a 16-bit value, etc.) such that they require less storage space than the actual column values the special encoded values represent. Tables compressed in this manner require less storage capacity than un-compressed tables In a typical database system, various types of operations, such as join operations, can be performed on tables. Computed data generated in a database operation is stored in an intermediate table (also referred to as a "spool table") or result table. Thus, in a database operation, content of one or more tables (referred to as "parent tables") is accessed for projection into an intermediate or result table. Conventionally, although value list compression may be applied to one or more parent tables, a technique is generally unavailable to efficiently extend value list compression to an intermediate or result table used in a database operation.

SUMMARY

In general, methods and apparatus are provided to base compression of a result or intermediate table used in a database operation on inheriting compression used for a parent table or deriving the compression based on one or more conditions specified in the database operation.

Other or alternative features will become apparent from the following description, from the drawings, and from the claims.

DETAILED DESCRIPTION

Figure 1:
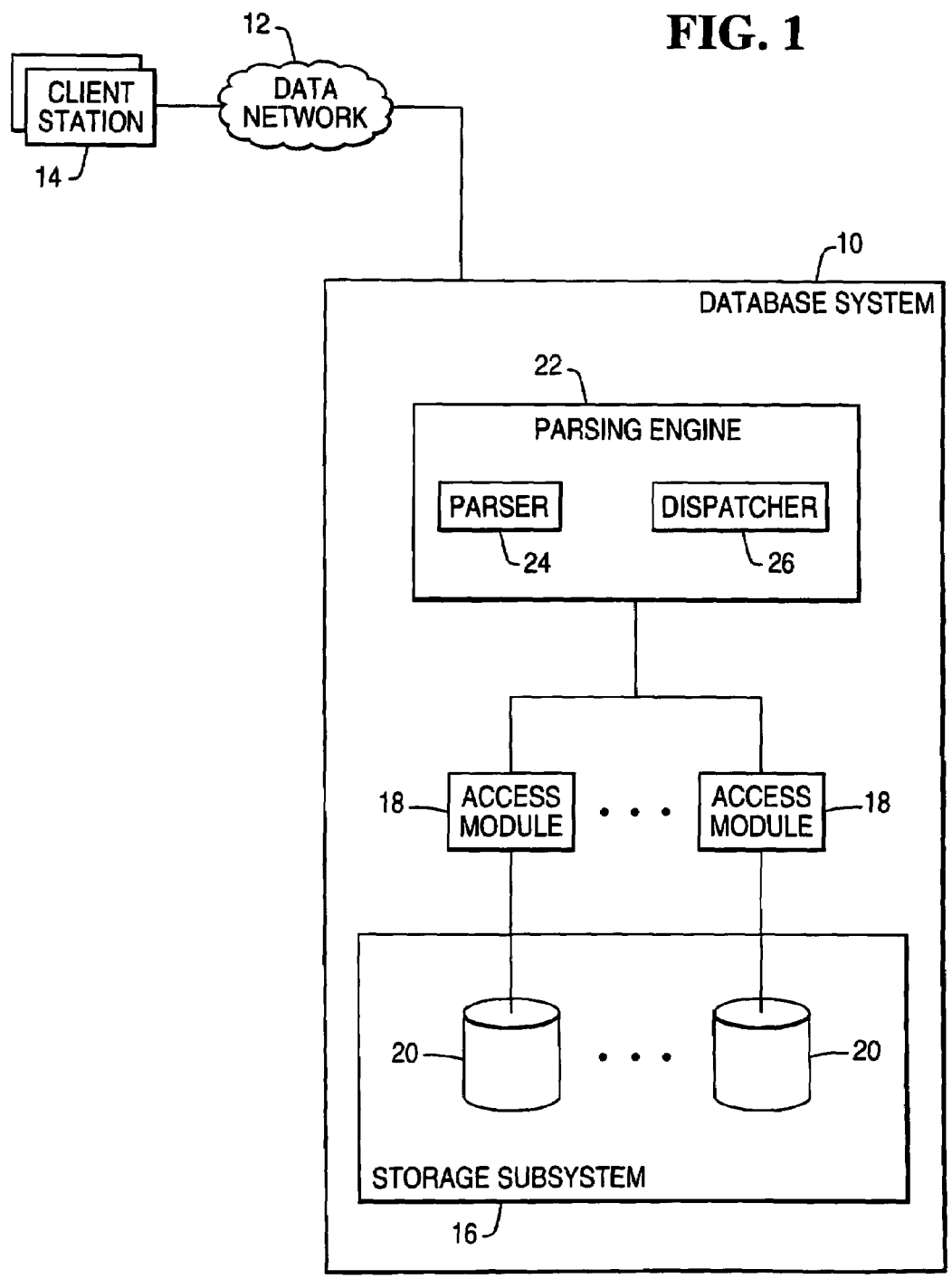
FIG. 1 is a block diagram of an arrangement including an example database system.

In the following description, numerous details are set forth to provide an understanding of the present invention. However, it will be understood by those skilled in the art that the present invention may be practiced without these details and that numerous variations or modifications from the described embodiments are possible.

According to some embodiments of the invention, a database system (such as an example database system 10 shown in FIG. 1) is capable of performing value list compression on columns in tables stored in the database system. Value list compression refers to the compression of frequently occurring data values of a given column in a table. Value list compression involves identifying such frequently occurring data values of a column in a table, and substituting encoded values for the actual data values in each table. In some implementations, the encoded values are stored in row headers (rather than in a data field of a given row) so that no storage space needs to be allocated for the corresponding column in the data fields of the row. In another implementation, the encoded values are stored in data fields of respective rows.

Each table includes multiple rows, each associated with a row header that contains a row identifier in conjunction with other information, including the encoded value for value list compression. The encoded value is a fixed length value (e.g., an 8-bit value, 16-bit value, etc.) that occupies less space than the actual column value would occupy in the table. As a result, by substituting the encoded values for corresponding frequently occurring data values of a column, space savings can be achieved.

The frequently occurring data values of a given column in a table are stored in a predetermined data structure, such as a value list. The value list is a list of the frequently occurring column data values. If multiple tables and/or columns are subject to value list compression, then multiple corresponding value lists are maintained. If a row to be inserted into a table contains a column having one of the values in the value list for the table, the database software substitutes a corresponding encoded value for the data value.

In accordance with some embodiments of the invention, to increase storage efficiency, value list compression is applied to intermediate or result tables that store data generated by database operations. The value list compression applied to the intermediate or result tables inherits some or all of the frequently occurring data values used for value list compression of a parent table (or parent tables) involved in the database operation.

In another embodiment, a column(s) of a parent table(s) is not compressed. However, value list compression can nevertheless be derived for an intermediate or result table based on one or more conditions to be applied during a database operation. Thus, two techniques are available to apply value list compression on an intermediate or result table: (1) an inheritance technique to inherit the value list(s) of parent table(s); and (2) a derivation technique to derive a value list for compressing an intermediate or result table based on one or more conditions specified by a database operation.

The arrangement shown in FIG. 1 includes the database system 10, which is coupled to one or more client stations 14 over a data network 12. Examples of the data network 12 include a local area network (LAN), a wide area network (WAN), the Internet, and so forth. Each of the client stations is capable of issuing queries according to a standard database query language, such as SQL (Structured Query Language), to the database system 10 to access (read, insert, update, or delete) data, or to create, delete or alter data structures (e.g., tables, views, and so forth).

The database system 10 shown in FIG. 1 is an example of a parallel database system having multiple processing units to enable the concurrent processing or access of data stored in a storage subsystem 16. Each processing unit in the database system 10 is in the form of an access module 18 (plural access modules 18 are shown in FIG. 1). Each access module 18 performs the following tasks: inserts, deletes, or modifies contents of tables; creates, modifies, or deletes definitions of tables; retrieves information from definitions and tables; and locks databases and tables. In one example, each access module 18 is based on an access module processor (AMP) used in some TERADATA® database systems from NCR Corporation.

Each access module 18 manages access of data in respective storage modules 20 of the storage subsystem 16. Tables are stored in the storage modules 20. In the parallel database system example of FIG. 1, a table is distributed across multiple storage modules to enable the concurrent access of data in the table. However, instead of a parallel database system, a single-processor database system can be used in another embodiment.

The database system 10 also includes a parsing engine 22, which includes a parser 24 and a dispatcher 26. The parser 24 checks a received query for syntax. Also, the parser 24 includes an optimizer to generate a query or execution plan for the received query. The steps of the query plan are dispatched by the dispatcher 26 to the access modules 18 for execution. Effectively, the access modules 18 and parsing engine 22 are part of a database application or database engine of the database system 10.

Value list compression is performed by the parsing engine 22 in combination with the access modules 18. During a database operation, such as a join operation or other type of operation, that involves a parent table (or plural parent tables), intermediate tables (referred to as spools) and/or result tables are used to store intermediate and/or final results of a database operation.

Figure 2:
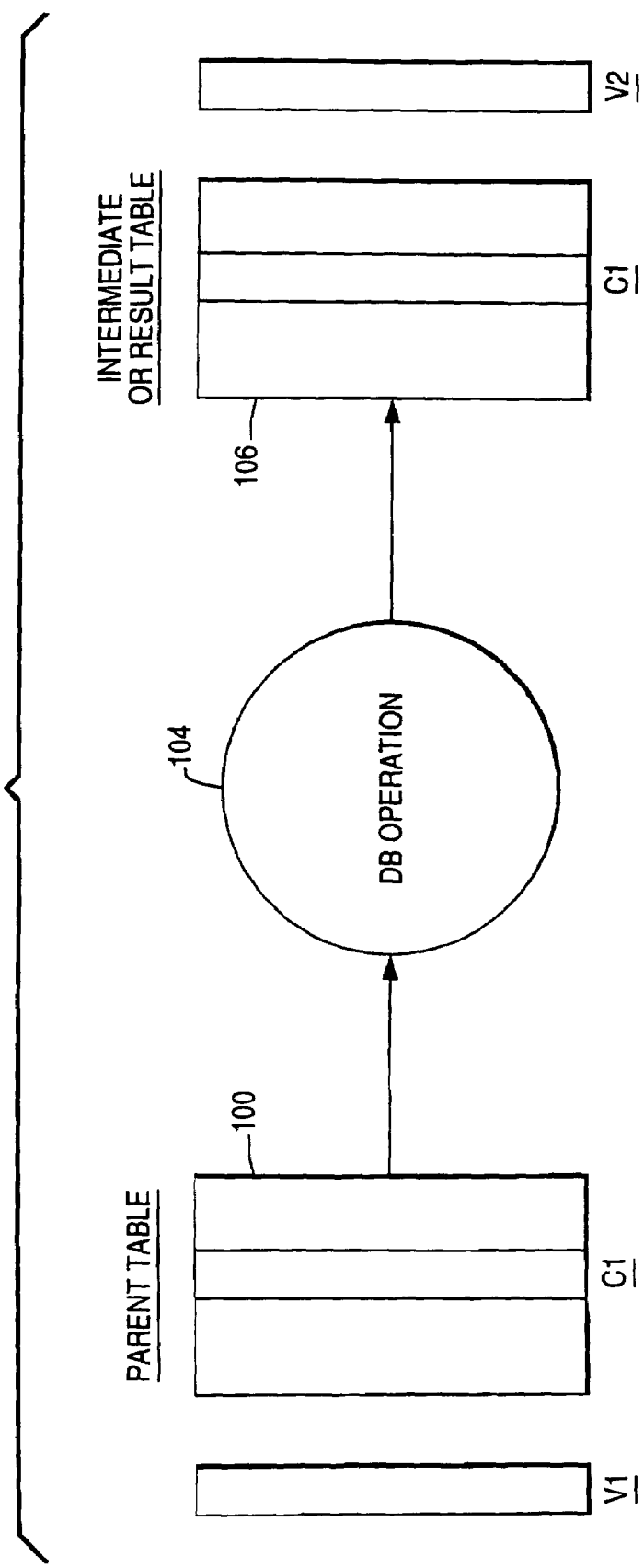
FIG. 2 illustrates the compression of a column of an intermediate or result table based on a value list of a parent table.

As shown in FIG. 2, a parent table 100 (which can be a base table or a prior intermediate or result table) can be associated with a value list V1 containing the frequently occurring data values of a column C1 in the parent table. Using the content of the value list V1, the database software is able to perform value list compression on the column C1 of the parent table.

In accordance with some embodiments of the invention, to improve efficiency in the storage of an intermediate and/or result table 106 that results from a database operation 104, a value list V2 is associated with the intermediate/result table 106 to enable value list compression of the intermediate/result table 106. The value list V2 contains the frequently occurring data values of column C1 in the intermediate/result table 106. According to the inheritance technique, the value list V2 is inherited from the value list V1 associated with the parent table 100. Depending on the database operation 104, the value list V2 can be identical to the value list V1, or the value list V2 is a subset of the value list V1 after application of certain conditions specified by the database operation 104. The conditions specified by the database operation 104 cause certain data values in the value list V1 to not be included in the value list V2. More generally, according to the inheritance technique, the value list V2 for the intermediate or result table 106 is based on inheritance of compression specifications (the value list V1) for the parent table 100.

According to the derivation technique, the value list V1 associated with the parent table 100 need not be present. The value list V2 for the intermediate or result table 106 is derived from one or more conditions specified by the database operation 104.

Although reference is made to value list compression in the description, it is noted that other types of compression are performed in other embodiments. In such other embodiments, the compression specifications used for compression of content of an intermediate or result table are based on or inherited from compression specifications used for compression of one or more parent tables. The term "compression specifications" refers to data values or codes used to apply compression on content (rows, columns, or other entries) of a table. Alternatively, according to the derivation technique, compression specifications for an intermediate or result table are derived based on one or more conditions specified by a database operation.

The following discusses various example cases in which the inheritance of value lists is performed in database operations involving one or more parent tables. In a first case (case 1), a column of a parent table (which is compressed on the value list V1) is projected to a result table with no predicate applied on the column. In other words, the entire column is projected into the result table. In this case, the value list V1 is used as the value list for compressing the projected column in the result table.

In a second case (case 2), a column of a parent table that is compressed on value list V1 is selected with a predicate expression P. An example of such an operation is based on the following:

T1.COLUMN_A is defined as a FLOAT type
T1.COLUMN_A is compressed on values V1={1.0,2.0, 3.0,4.0,5.0,6.0,7.0,8.0,9.0,10.0,11.0,12.0,13.0,14.0}
INSERT INTO T2 SELECT 11.* FROM T1 WHERE T1.COLUMN_A>6 AND T1.COLUMN_A<13;

In the example above, the parent table is table T1, and the column COLUMN_A of T1 is compressed on value list V1. The content of table T1 is inserted into result table T2, based on the predicate T1.COLUMN_A being greater than 6 and T1.COLUMN_A being less than 13. This predicate is applied to the value list V1 to determine a value list V2. Based on the example predicate, the value list V2 is as follows:

V2={7.0,8.0,9.0,10.0,11.0,12.0}.

In this case, the selected column COLUMN_A of table T2 is compressed using the value list V2. In this second case, the predicate expression P is applied to the value list V1 to derive the content of the value list V2. In this example, the content of V2 contains data values between 6 and 13. Note that in other examples, there is a possibility that value list V2 can be an empty set based on the predicate expression P.

In a third case (case 3), a column of a parent table compressed on the value list V1 is selected with a predicate expression P and operated on with an operator O. An example of this case is based on the following:

COLUMN_A is an INTEGER type compressed on V1={0,1,2,3,4,5,6,7,8,9}
SELECT COLUMN_A+1 FROM T1 WHERE COLUMN_A IN (1,2,3);

In the above example, the predicate expression P is the enumeration COLUMN_A IN (1,2,3). The SELECT query specifies the following operation, COLUMN_A+1, which involves an operator O that is "+1". In this case, the predicate expression P is applied to the value list V1 to derive the value list V2. In addition, the operator O (in this case the "+1" operator) is operated on value list V2 to derive a value list V3, which is the value list for compressing the selected column in the result table (assuming that the value list V3 is not an empty set). In the above example, the value list V3 is as follows: V3={2, 3, 4}, which results from V2+1, where V2={1, 2, 3}.

In a fourth case (case 4), an equijoin is performed on at least two parent tables. The database operation in this case is a join operation that joins multiple parent tables. An example euijoin operation is as follows:

SELECT *
FROM T1, T2
WHERE T1.A=T2.B;

In the example above, the rows selected from tables T1 and T2 are those rows where column A in T1 is equal to column B in T2. All columns of tables T1 and T2 are projected to the result table.

In the case 4, only the equijoin column of one parent table (e.g., column B of T2) is compressed on a value list V1. In this case, the value list V1 of the one parent table is used to compress the selected column in the result table (which contains projected columns of both parent tables).

A fifth case (case 5) also involves an equijoin of at least two parent tables. However, in case 5, the equijoin columns of both parent tables are compressed on respective value lists V1 and V2. In other words, the equijoin column (A) of table T1 is compressed on value list V1, and the equijoin column (B) of table T2 is compressed on value list V2. The equijoin operation is based on T1.A=T2.B. To derive the value list for the result table, an equijoin is performed of the value lists V1 and V2 for the two parent tables to yield a value list V3. Here, if V3 is not an empty set, then the value list V3 is used as the value list for compressing the selected column of the result table equijoin operation.

In another example (case 6), non-equality join columns of a non-equality join operation are compressed in both parent tables. In this case, a non-equality join is performed on the value lists V1 and V2 for both parent tables to yield a result value list V3. An example of case 7 is based on the following:

T1.A is an integer column compressed on V1={5, 10, 15, 20, 25, 30, 35, 40, 45, 50}
T2.B is an integer column compressed on V2={30, 40, 50, 60, 70, 80, 90, 100}
INSERT INTO T2 SELECT T1.* FROM T1, T2 WHERE T1.A>T2.B;

The non-equality join is performed on the value lists V1 and V2 to produce the value list V3. In the above example, the content of V3 is {35, 40, 45, 50}. If V3 is not empty, and the cardinality of V3 is less than a predetermined value V, then V3 is used as the value list for compressing the selected column in the result table. The predetermined value V, according to one implementation, is the maximum number of values that can be present in a value list. If the cardinality of V3 exceeds the predetermined value V, then V values from V3 are used as the value list for compressing the selected column in the result table.

The above examples lists examples of the inheritance technique of determining a value list for compressing an intermediate or result table. The examples below illustrate cases for the derivation technique. In the discussion below, it is assumed that the database system is capable of supporting up to a maximum number (V) of values in a value list. In other database systems, no maximum number of values is specified for value lists.

In the example below, it is also assumed that parent table(s) are not associated with value list(s). In a first case (case A), a database operation specifies a predicate enumeration on a selected column. An example of predicate enumeration is found in the following query:

SELECT*FROM T1 WHERE COLUMN_A IN (1,3,4,8, 10,12);

In the query above, the predicate enumeration is COLUMN_A IN (1,3,4,8,10,12). Note that the enumerated values are discrete values, such as integer values and decimal values. The selected rows are the rows containing COLUMN_A having one of the enumerated values. More generally, let E be the set of enumerated values (also referred to as enumerated match conditions). If E is the empty set, then no compression is performed on the result table.

However, if the cardinality of E is less than or equal to V, then E is used as a value list for compressing the selected column in the result table. Thus, in case A, E is the derived value list based on a predicate of a query for the database operation. If the cardinality of E is greater than V, but less than or equal to an arbitrary value Z, then V arbitrary values are selected from E as the value list for compressing the selected column in the result table. On the other hand, if the cardinality of E is greater than Z, then no compression is performed. The value of Z is selected based on a tradeoff between compression overhead, data type storage consumption, and probability of compression on the predetermined number of values, assuming a random hit rate.

Based on this criteria, the derived value list for the result table in the example query above is {1, 3, 4, 8, 10, 12}, provided that V is greater than or equal to 6.

In another case (case B), instead of a predicate enumeration, a predicate range is specified in a query (e.g., COLUMN_A>6 and COLUMN_A<13). The predicate range can be rewritten as a predicate enumeration as in the example above. This rewritten enumerated query involves enumerated match conditions F. The same conditions as above can be applied to the enumerated match conditions F to derive the value list for the intermediate or result table.

Similarly, for a database operation that involves a predicate expression and an operator (case C), a query can be rewritten as an enumerated query with enumerated match conditions G. The same criteria are applied to derive the value list.

Any combination of the three example cases (case A, B, and C) above can be involved in a particular database operation. In such a case, the sets E, F, and G are determined as discussed above. Next, a set H is defined as the union of sets E, F, and G. Then, the same criteria as described for case A are applied to derive the value list for the intermediate or result table.

Figure 3:
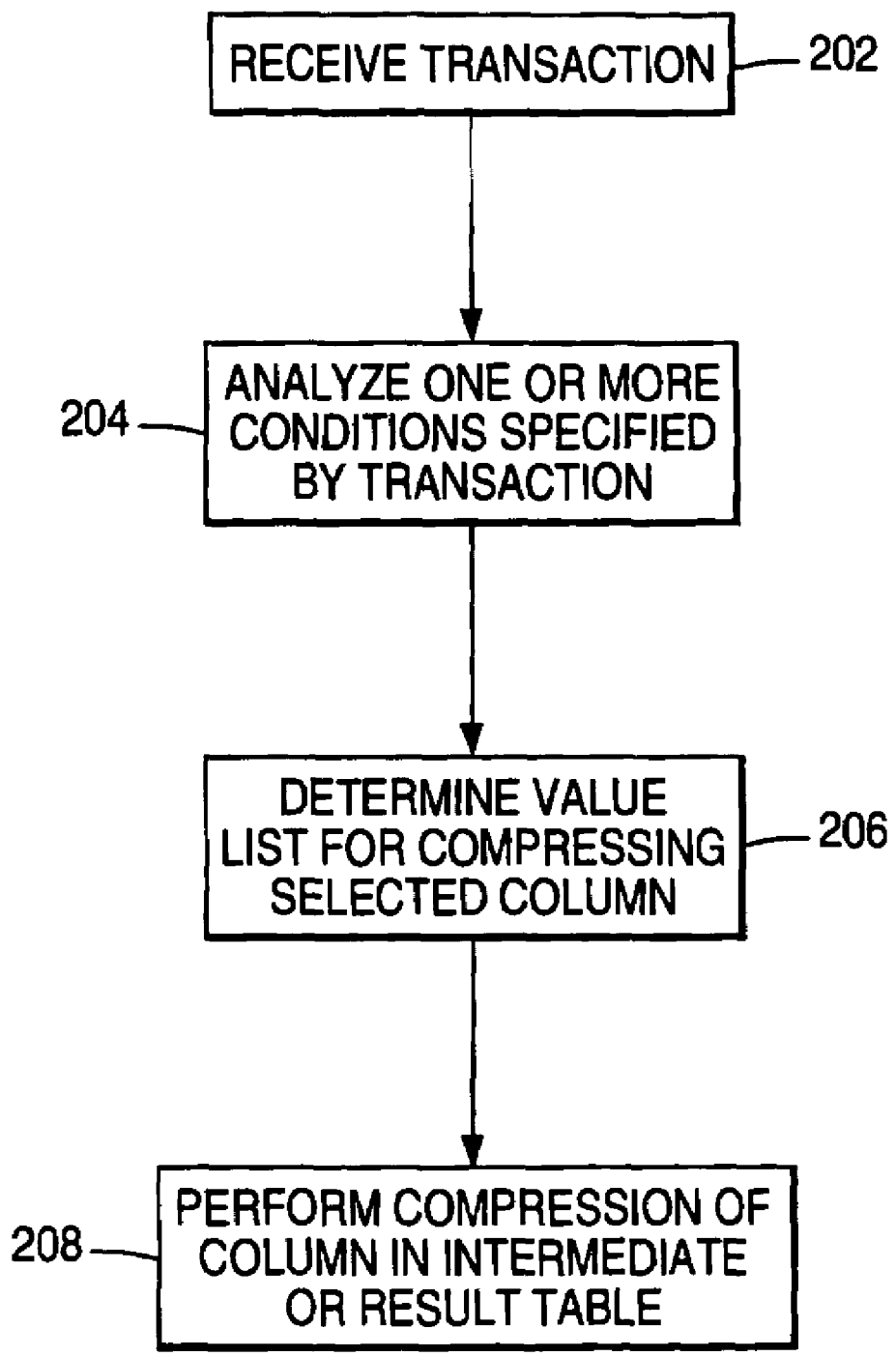
FIG. 3 is a flow diagram of a process of compressing a column in an intermediate or result table, according to an embodiment of the invention.

FIG. 3 is a flow diagram of a process of determining the value list for an intermediate or result table used in a database operation. The database software receives (at 202) a transaction, which can be any one of the database operations discussed above, or any other transaction. The transaction involves one or more parent tables, and the insertion of data into one or more intermediate and/or result tables.

The one or more conditions specified by the transaction are analyzed (at 204) by the database software. The one or more conditions include application of predicates, enumerations, joins, column-level constraints, conditions specified in a conditional statement (e.g., a MATCH CASE statement or an IF statement), and so forth. Based on the specified one or more conditions, the database software determines (at 206) the value list for compressing the selected column of the intermediate and/or result table. The determination of the value list can either use the inheritance technique or the derivation technique. The database software then performs (at 208) compression of the selected column in the intermediate and/or result table using the determined value list.

Instructions of the various software routines or modules discussed above (such as the database software including the access modules and parsing engine) are executed on corresponding control modules. The control modules include microprocessors, microcontrollers, processor modules or subsystems (including one or more microprocessors or microcontrollers), or other control or computing devices. As used here, a "controller" refers to hardware, software, or a combination thereof. A "controller" can refer to a single component or to plural components (whether software or hardware).

Data and instructions (of the various software routines or modules) are stored on one or more machine-readable storage media. The storage media include different forms of memory including semiconductor memory devices such as dynamic or static random access memories (DRAMs or SRAMs), erasable and programmable read-only memories (EPROMs), electrically erasable and programmable read-only memories (EEPROMs) and flash memories; magnetic disks such as fixed, floppy and removable disks; other magnetic media including tape; and optical media such as compact disks (CDs) or digital video disks (DVDs).

The instructions of the software routines or modules are loaded or transported to a system in one of many different ways. For example, code segments including instructions stored on floppy disks, CD or DVD media, a hard disk, or transported through a network interface card, modem, or other interface device are loaded into the system and executed as corresponding software modules or layers. In the loading or transport process, data signals that are embodied in carrier waves (transmitted over telephone lines, network lines, wireless links, cables, and the like) communicate the code segments, including instructions, to the system. Such carrier waves are in the form of electrical, optical, acoustical, electromagnetic, or other types of signals.

While the present invention has been described with respect to a limited number of embodiments, those skilled in the art, having the benefit of this disclosure, will appreciate numerous modifications and variations therefrom. It is intended that the appended claims cover all such modifications and variations as fall within the true spirit and scope of this present invention.

What is claimed is:

1. A method for use in a database system, comprising:
performing value list compression, using a first value list, of a column of a first table based on frequently occurring values of the column, wherein the first value list contains the frequently occurring values, wherein performing compression of the column of the first table causes encoded values to be stored in the first table instead of data values of the column of the first table;
inserting data into a second table as a result of a database operation involving the first table;
performing value list compression, using a second value list, of a column of the second table by inheriting the frequently occurring values of the column of the first table, wherein the second value list contains at least a subset of the first value list, wherein performing compression of the column of the second table causes encoded values to be stored in the second table instead of data values of the column of the second table, wherein the database operation specifies one or more conditions to apply to the column of the first table; and
generating the second value list from the first value list based on the one or more conditions to apply to the column of the first table.

2. The method of claim 1, wherein generating the second value list comprises applying a predicate specified in a query for the database operation on the first value list.

3. The method of claim 2, wherein generating the second value list further comprises applying an operator specified in the query for the database operation on the first value list.

4. The method of claim 1, wherein generating the second value list comprises applying a column-level constraint to the first value list.

5. The method of claim 1, wherein generating the second value list comprises applying a join condition to the first value list.

6. The method of claim 1, wherein generating the second value list comprises applying a condition specified in a conditional statement associated with the database operation.

7. The method of claim 1, further comprising projecting selected data values of the column in the first table into the column in the second table in the database operation.

8. An article comprising at least one storage medium containing instructions that when executed cause a database system to:
perform compression, using a first value list, of a column of a first table based on frequently occurring values of the column of the first table, wherein the first value list contains the frequently occurring values, wherein performing compression of the first table causes encoded values to be stored in the first table instead of data values of the column of the first table;
insert data into a second table as a result of a database operation involving the first table;
perform compression, using a second value list, of a column of the second table, based on inheritance of the frequently occurring values of the column of the first table, wherein the second value list contains at least a subset of the first value list, wherein performing compression of the second table causes encoded values to be stored in the second table instead of data values of the column of the second table, wherein the database operation specifies one or more conditions to apply to the column of the first table; and
generate the second value list from the first value list based on the one or more conditions to apply to the column of the first table.

9. The article of claim 8, wherein generating the second value list comprises applying at least one of a predicate and an operator specified in a query for the database operation on the first value list.

10. The article of claim 9, wherein generating the second value list further comprises applying a column-level constraint to the first value list.

11. The article of claim 8, wherein generating the second value list comprises applying a join condition to the first value list.

12. The article of claim 11, wherein applying the join condition comprises applying an equijoin condition.

13. The article of claim 12, wherein the database operation comprises a join operation to join at least a first parent table and a second parent table, the first parent table associated with the first value list, and the second parent table associated with a third value list for compressing a column of the second parent table,
wherein generating the second value list comprises performing an equijoin of the first and third value lists.

14. The article of claim 11, wherein applying the join condition comprises applying a non-equality join condition.

15. A database system comprising:
storage to store a first table and a second table; and
a controller to:
- perform compression of a column of the first table using first specifications, wherein performing compression of the column of the first table causes encoded values to be stored in the first table instead of data values of the column of the first table;
- receive a transaction specifying one or more conditions to apply on the first table;
- insert data into the second table as a result of the transaction involving the first table;
- perform compression of the second table using second compression specifications derived based on the one or more conditions specified in the transaction, wherein the compression comprises value list compression of a column of the second table that is based on a value list containing values of the column of the second table, wherein the second compression specifications comprise the value list,
- wherein the one or more conditions comprise a predicate enumeration that includes an enumerated list of column values, and where the value list comprises the enumerated list of values.

16. A database system comprising:
storage to store a first table and a second table; and
a controller to:
- perform compression of a column of the first table using first specifications, wherein performing compression of the column of the first table causes encoded values to be stored in the first table instead of data values of the column of the first table;
- receive a transaction specifying one or more conditions to apply on the first table;
- insert data into the second table as a result of the transaction involving the first table;
- perform compression of the second table using second compression specifications derived based on the one or more conditions specified in the transaction, wherein the compression comprises value list compression of a column of the second table that is based on a value list containing values of the column of the second table, wherein the second compression specifications comprise the value list,
- wherein the one or more conditions comprise a predicate range condition, and wherein the controller is adapted to generate an enumerated list of column values from the predicate range condition, the value list comprising the enumerated list.

17. A database system comprising:
storage to store a first table and a second table; and
a controller to:
- perform compression of a column of the first table using first specifications, wherein performing compression of the column of the first table causes encoded values to be stored in the first table instead of data values of the column of the first table;
- receive a transaction specifying one or more conditions to apply on the first table;
- insert data into the second table as a result of the transaction involving the first table;
- perform compression of the second table using second compression specifications derived based on the one or more conditions specified in the transaction, wherein the compression comprises value list compression of a column of the second table that is based on a value list containing values of the column of the second table, wherein the second compression specifications comprise the value list,
- wherein the one or more conditions comprise a predicate expression, and wherein the controller is adapted to generate an enumerated list of column values based on the predicate expression, the value list comprising the enumerated list.

18. The database system of claim 17, wherein the controller comprises a database engine having plural access modules to concurrently access plural respective storage modules in the storage.

19. The database system of claim 18, wherein the access modules are adapted to perform compression of the first table in parallel, and to perform compression of the second table in parallel.

* * * * *